(12) United States Patent
Hsieh

(10) Patent No.: US 6,861,888 B2
(45) Date of Patent: Mar. 1, 2005

(54) HIGH-SENSITIVITY DIFFERENTIAL DATA LATCH SYSTEM

(75) Inventor: Kuo-Chiang Hsieh, Palo Alto, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 624 days.

(21) Appl. No.: 10/051,836

(22) Filed: Jan. 16, 2002

(65) Prior Publication Data

US 2003/0132791 A1 Jul. 17, 2003

(51) Int. Cl.[7] .............................................. H03K 3/356
(52) U.S. Cl. ...................... 327/208; 327/203; 327/218
(58) Field of Search ............................ 327/57, 96, 208, 327/209, 210, 211, 212, 213, 218, 202, 203

(56) References Cited

U.S. PATENT DOCUMENTS 5,510,734 A * 4/1996 Sone ............................ 327/65
5,850,155 A * 12/1998 Matsumoto .................. 326/109
6,798,263 B1 * 9/2004 Leon ............................ 327/203
2003/0141912 A1 * 7/2003 Sudjian ....................... 327/208

* cited by examiner

Primary Examiner—Tuan T. Lam

(57) ABSTRACT

A data latch system includes a data input for providing a first data bit having a first duration and a second data bit having a second duration, and a data output for providing the first data bit for the first and second durations. First sampling circuitry is connected to the data input and the data output for the first duration to provide the first data bit to the data output. Second sampling circuitry is connected to the data input and the data output for the second duration to provide the second data bit inverted to the data output. Holding circuitry connected to the data output for the second duration holds the first data bit and the second sampling circuitry connects the second data bit inverted to the data output to enhance the held first data bit when the first and second data bits have different states.

26 Claims, 8 Drawing Sheets

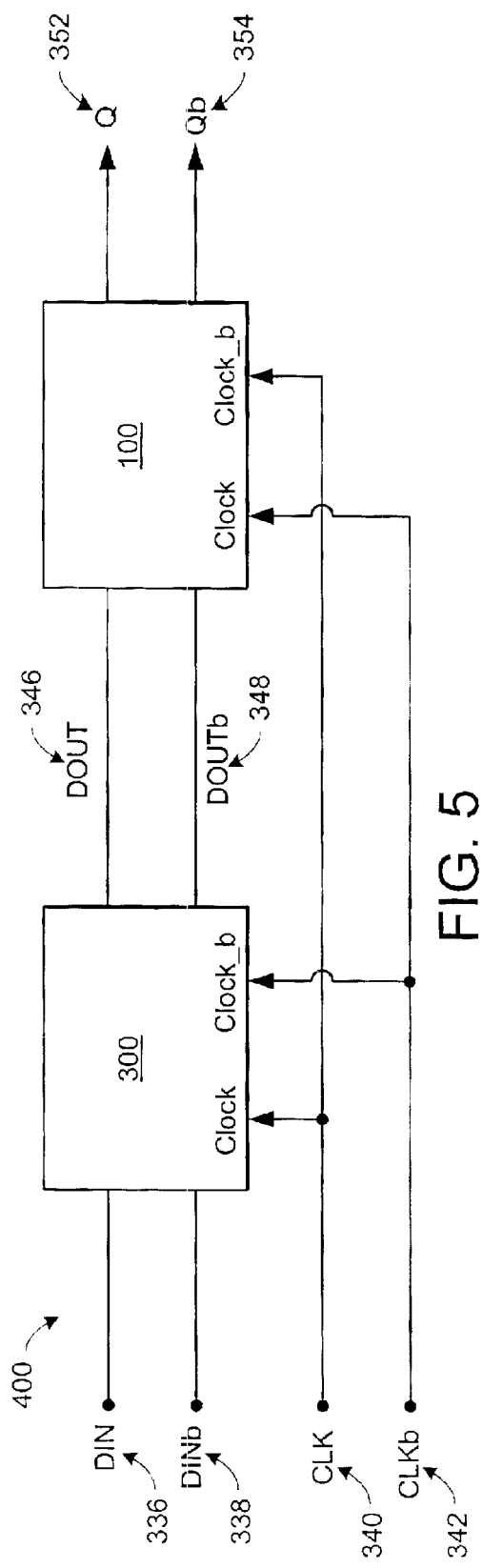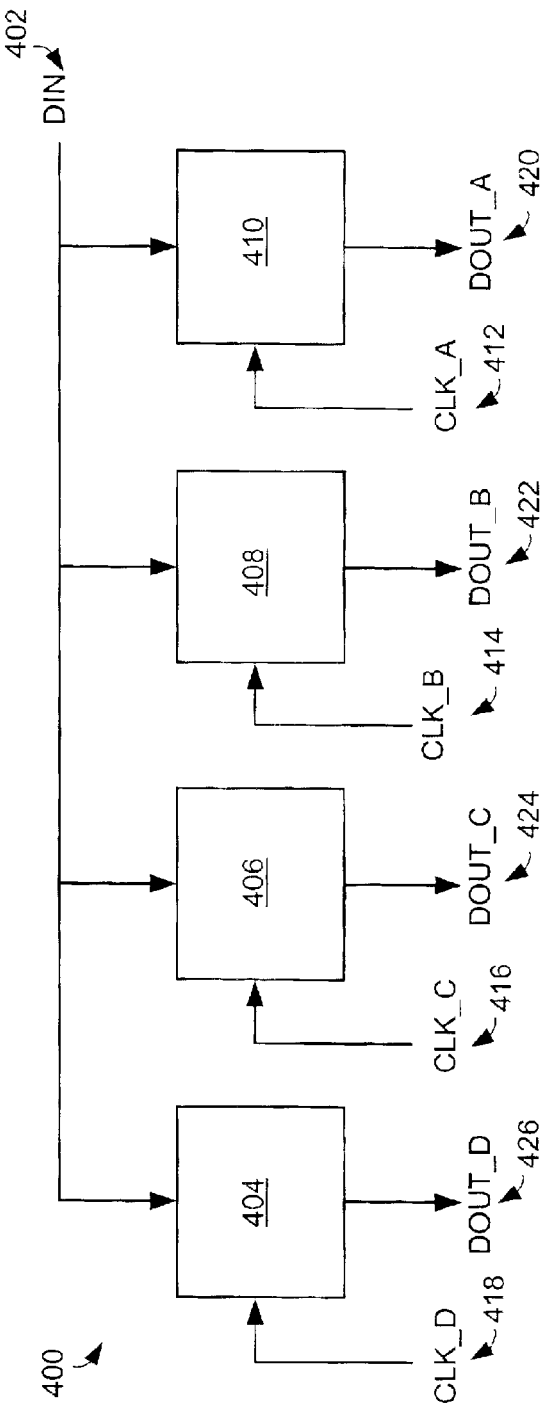
FIG. 5
FIG. 6

HIGH-SENSITIVITY DIFFERENTIAL DATA LATCH SYSTEM

BACKGROUND

1. Technical Field

The present invention relates generally to differential data latch systems and more specifically to achieving higher sensitivity and higher speed in such systems.

2. Background Art

Differential data latch systems have been used in digital circuits that require a sample-and-hold of a data stream so that subsequent circuits can perform digital functions such as synchronization, delay, multiplex/demultiplex, frequency division, and other digital signal processing (DSP) operations, which are essential to modern electronic systems.

When conventional latch systems are used to sample a fast data stream, they must sample and hold data within a fraction of the data bit-width, which is the duration of two adjacent high-to-low and low-to-high transitions when the data is at its highest rate. The minimum times required for the conventional latch systems to sample and hold the data are referred to as the setup and hold times, respectively.

More specifically, the setup time is the minimum amount of time required for the conventional latch system to sample the data signal after the data is switched to a new state in a sample mode and to produce a sufficient amount of signal to successfully hold the sampled data in a subsequent hold mode. The setup time is defined as the amount of time between the mid-point of the data transition and the mid-point of the clock transition. The sample and hold modes are switched by the transitions of a clock.

The hold time refers to the minimum amount of time required for the conventional latch system to hold the sampled data after the clock transition to the hold mode and before the conventional latch system is switched to a different state. Like the setup time, it is also defined as the amount of time between the mid-point of the clock and the mid-point of the data transition, but in this case, the time indicates the time required for correct operation after a clock transition instead of before a clock transition.

The hold time represents the minimum amount of time the data signal must maintain a sufficient amount of voltage after the clock transition to the hold mode in order for data regeneration to occur so the data will be held. In order for data regeneration to occur, the output voltage must reach a certain level. If the clock and data stream are too fast, the difference of the transition times could be less than the minimum required hold time for successful operation of the conventional latch system and the output voltage will not have time to reach the desired level for data regeneration and the conventional latch system will lose the data in the hold mode.

A major problem occurs when the speed of operation of the conventional latch systems increases. Because the setup and hold times represent the minimum time necessary for successful operation, they are the limiting factors when increasing the speed of the clock and data stream.

The above is a particularly serious problem when the conventional latch systems are used in multiple-phase data demultiplexer systems. In these demultiplexer systems, a number of differential latch systems are connected to clocks, which are offset in phase from each other. They share a single serial data stream, which requires demultiplexing.

The data stream does not cause a problem in the conventional latch systems when two consecutive bits in the serial data stream are at the same state.

However, when the next bit in the serial data stream is in an opposite state from the prior bit, there is a significant amount of disturbance in the voltage. Unfortunately, this disturbance reduces the amount of voltage available for regeneration and causes the conventional latch system to not be able to hold the data, thus limits the ability of the conventional latch system to operate at higher speeds.

Thus, to increase the speed of the clock and data stream in multiple-phase demultiplexer system, the hold time must be extended when there are opposite consecutive switching bits in the data stream.

Another major problem with the conventional latch system is its lack of sensitivity. Lack of sensitivity is defined as requiring a higher input voltage in order to operate. This is an issue because in actual operating conditions, the amplitude of incoming data bits can be very low due to attenuation caused by external transmission media, such as transmission lines and systems. If the amplitude of the incoming data bit is too low, data regeneration cannot occur and the conventional latch system loses the previously sampled data. This leads to errors in data transmission. Because the integrity of data can depend on the sensitivity, increasing the sensitivity of differential latch systems is imperative.

Solutions to these problems have long been sought but have long eluded those skilled in the art.

DISCLOSURE OF THE INVENTION

The present invention provides a data latch system including a data input for providing a first data bit having a first duration and a second data bit having a second duration, and a data output for providing the first data bit for the first and second durations. First sampling circuitry is connected to the data input and the data output for the first duration to provide the first data bit to the data output. Second sampling circuitry is connected to the data input and the data output for the second duration to provide the second data bit inverted to the data output. Holding circuitry connected to the data output for the second duration holds the first data bit and the second sampling circuitry connects the second data bit inverted to the data output to enhance the held first data bit when the first and second data bits have different states. This results in latch system with higher sensitivity to the incoming data and with higher operating speeds due to the use of a subsequent data bit to stretch the holding process of the latch system and therefore extend the hold time of the latch system while the latch system is switched from sample mode to hold mode.

The above and additional advantages of the present invention will become apparent to those skilled in the art from a reading of the following detailed description when taken in conjunction with the accompanying drawings.

BRIEF DESCRIPTION OF THE DRAWINGS

FIG. 5 is a block diagram of a system with complete isolation from input to output according to the present invention; and FIG. 6 is a block diagram for a four-phase data demultiplexer system according to the present invention.

BEST MODE FOR CARRYING OUT THE INVENTION

Figure 1:
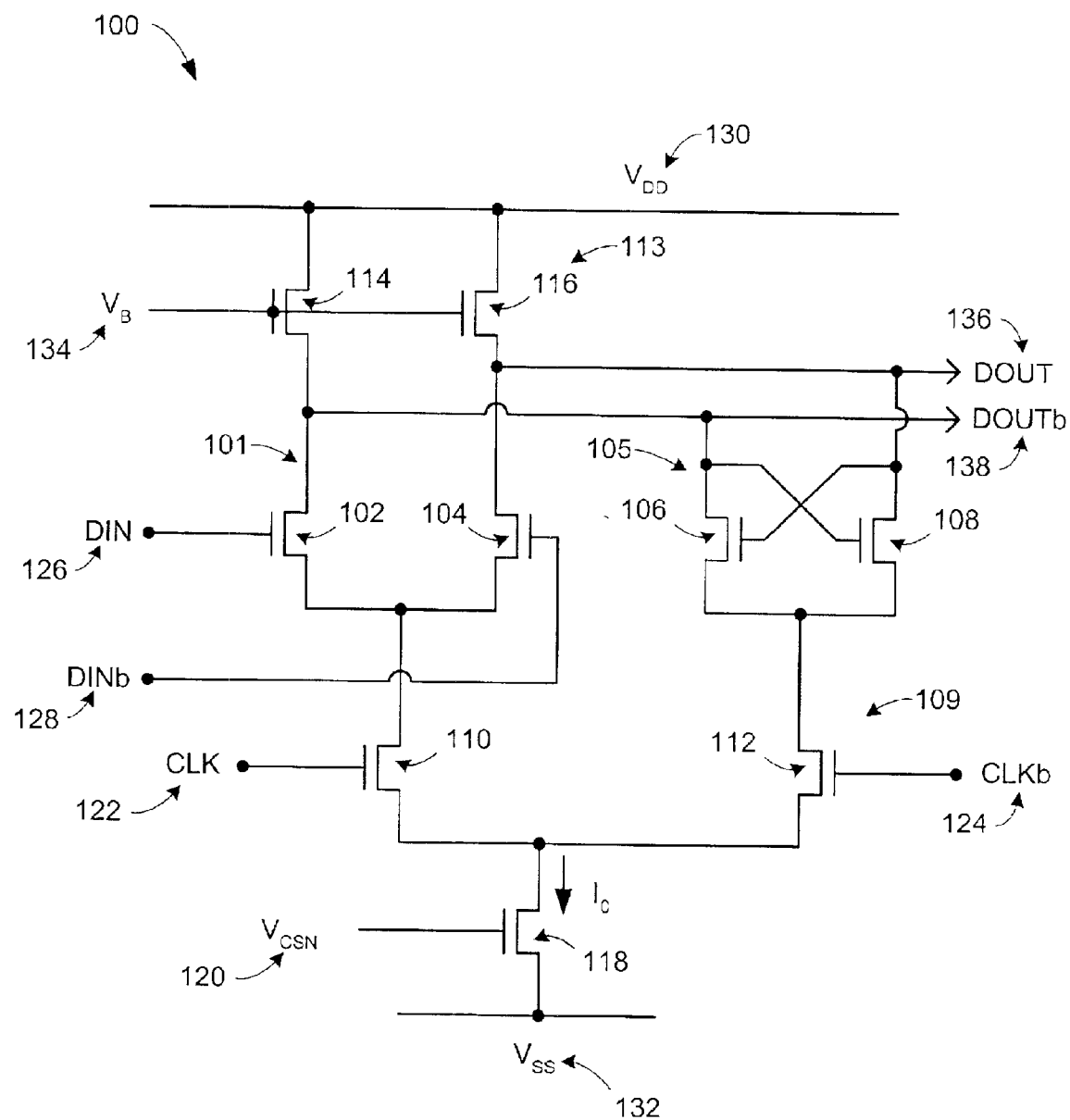
FIG. 1 (PRIOR ART) is a circuit schematic of conventional latch system.

Referring now to FIG. 1 (PRIOR ART), therein is shown a circuit schematic of conventional differential data latch circuitry 100 implemented in MOS technology. This conventional latch system 100 includes single sampling circuitry 101, holding circuitry 105, and single clocking circuitry 109.

The single sampling circuitry 101 consists of a differential pair of first and second sampling field-effect transistors (FETs) 102 and 104.

The holding circuitry 105 consists of a differential pair of first and second holding FETs 106 and 108 with their gates connected to the drains of their complementary FET.

The single clocking circuitry 109 consists of a differential pair of first and second clock FETs 110 and 112. The drains of the first and second clock FETs 110 and 112 are connected to the common-source of the single sampling circuitry 101 and the holding circuitry 105.

Load circuitry 113 acts as output loads and consists of first and second pull-up load FETs 114 and 116, which have sources respectively connected to the drains of the single sampling circuitry 101 and of the holding circuitry 105.

A current source 118 is biased by a voltage source $V_{CSN}$ 120 to produce a current $I_O$.

The first and second clock FETs 110 and 112 form a current switch driven by a differential pair of clocks at first and second clocks CLK 122 and CLKb 124. The common-source of the first and second clock FETs 110 and 112 is connected to the drain of the current source 118. The clocking circuitry 109 can direct the current $I_0$ from either the common-source of the single sampling circuitry 101 or of the holding circuitry 105.

The conventional latch system 100 is connectable to be powered by a positive power supply $V_{DD}$ 130 and a negative power supply $V_{SS}$ 132.

A differential pair of first and second data inputs DIN 126 and DINb 128 receives differential input data signals and is directly connected to bias the first and second sampling FETs 102 and 104, respectively. The drains of the first and second sampling FETs 102 and 104 are directly connected to a differential pair of first and second data outputs DOUT 136 and DOUTb 138, which output differential output data signals in the form of differential sample-and-hold of the signals on the DIN 126 and DINb 128. Connected to the DOUT 136 and DOUTb 138 are the second and first holding FETs 108 and 106, respectively.

When the voltage at the CLK 122 exceeds that at the CLKb 124 by a sufficient amount, the first clock FET 110 is switched on and the second clock FET 112 is switched off. The current $I_O$ flows through the first clock FET 110 from the single sampling circuitry 101. At this point in time, the conventional latch system 100 is in the sample mode, and its circuit configuration is equivalent to a differential amplifier with the inputs as the DIN 126 and DINb 128 and outputs as the DOUT 136 and DOUTb 138.

Similarly, when the voltage at the CLKb 124 exceeds that at the CLK 122 by a sufficient amount, the first clock FET 110 is turned off and the second clock FET 112 is on. The current $I_0$ flows through the second clock FET 112 from the holding circuitry 105. The connection of the holding circuitry 105 to the load circuitry 113 forms a positive-feedback loop. At this point in time, the conventional latch system 100 is now in the hold mode. Once the differential voltage, defined as DOUT 136–DOUTb 138, is over the threshold value of the positive-feedback loop, the circuitry will continue to proceed in the direction of enhancing the value of the differential voltage until it reaches a full logic high or low state. This is called "data regeneration". The state of logic high or low is defined by the final value of the differential voltage being positive or negative, respectively. Since the first clock FET 110 is turned off in the hold mode, the sampling circuitry 101 is biased off and therefore isolates the conventional latch circuitry 100 from getting new values of DIN 126 and DOUTb 128.

The sequential cycle of sample mode and hold mode completes the sample-and-hold process. The clock cycle repeats this procedure to sample-and-hold the incoming sequence of data signals. The voltage value of the state is determined by the difference of voltage drops by the currents from the positive power supply $V_{DD}$ 130 through the load circuitry 113.

When the conventional latch system 100 is used to sample a fast data stream, such as in a multiple-phase data demultiplexer, the conventional latch system 100 has to sample and hold the data within a fraction of the data bit-width. A bit-width is the duration of two adjacent high-to-low and low-to-high transitions when the data is at its highest rate. The data bit-width is much shorter than the clock period in a multiple-phase multiplex/demultiplex system. The setup time is fully defined in the Background and is basically the duration required from the time the data transition at the mid-point to the time that the output voltage (DOUT–DOUTb) is over the threshold of the positive-feedback loop and the regeneration process starts.

Figure 2A:
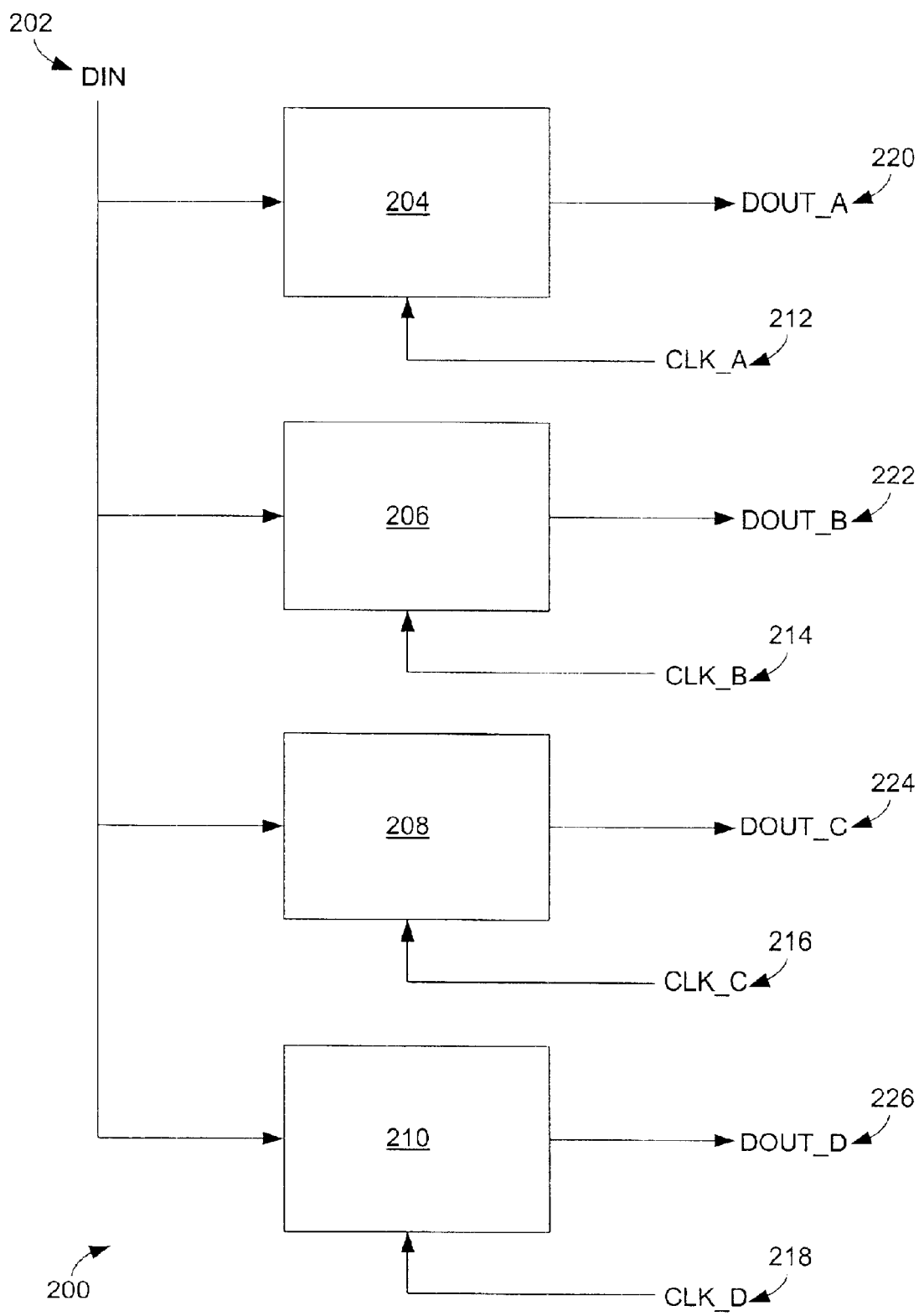
FIG. 2a (PRIOR ART) is a block diagram for a four-phase data demultiplexer system.

Referring now to FIG. 2a (PRIOR ART), therein is shown a block diagram of an exemplary four-phase data demultiplexer system 200 in which four data sampling channels are connected by four conventional latch systems designated as Latch A 204, Latch B 206, Latch C 208, and Latch D 210, similar to the conventional latch system 100 shown in FIG. 1 (PRIOR ART). The Latch A 204, Latch B 206, Latch C 208, and Latch D 210 are each driven by a clock, CLK_A 212, CLK_B 214, CLK_C 216, and CLK_D 218, respectively. The Latch A 204, Latch B 206, Latch C 208, and Latch D 210 are connected at their inputs to a data input DIN 202, and each has a respective demultiplexed data output DOUT_A 220, DOUT_B 222, DOUT_C 224, and DOUT_D 226.

Figure 2B:
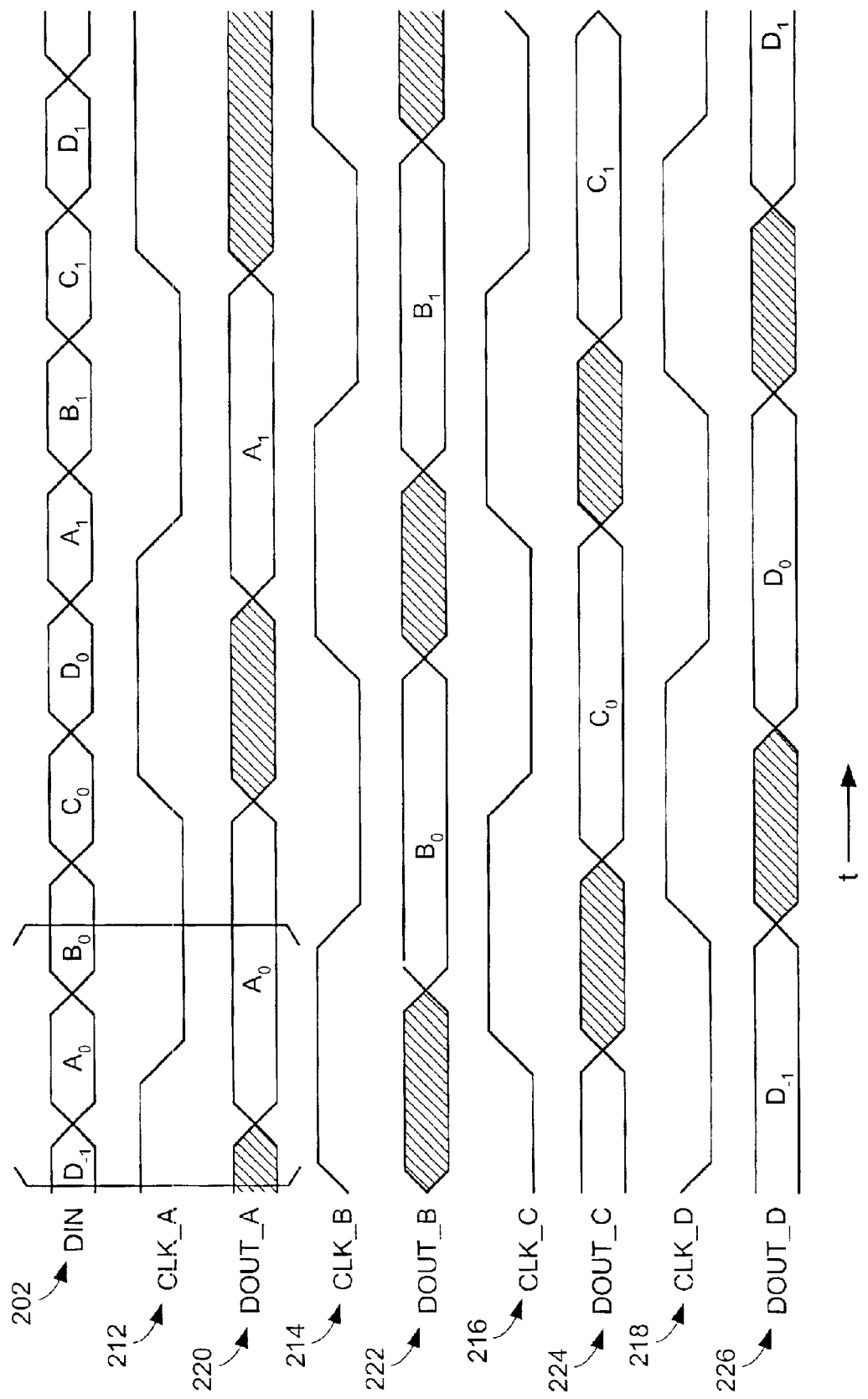
FIG. 2b (PRIOR ART) is a waveform diagram of the data and the clocks shown in FIG. 2a (PRIOR ART)

Referring now to FIG. 2b (PRIOR ART), therein is shown the waveform diagrams of the data and the clocks shown in the four-phase data demultiplexer system 200 of FIG. 2a (PRIOR ART). The data input DIN 202 is shown having a stream of data bits $A_0$, $B_0$, $C_0$, $D_0$, $A_1$, etc. The phases or durations of the CLK_A 212, CLK_B 214, CLK_C 216, and CLK_D 218 are 90 degrees apart from each other. One complete cycle of the clock has 360 degrees. The period of the clock is four times the data bit-width. The logic state in the shaded areas of the outputs DOUT_A 212, DOUT_B 124, DOUT_C 216, and DOUT_D 218 is determined by the state of the bits in the data input DIN 202 at that time and the logic state in the unshaded areas are determined by the sampled and held bits in the data input DIN 202 at the end of the sampling period. For example, the states in the shaded areas of the demultiplexed data output DOUT_A 220 are the outputs of bits $C_X$ and $D_X$ of the data input DIN 202, while the unshaded portions of the demultiplexed data output DOUT_A 220 are the result of the sampled and the held bit $A_X$ of the data input DIN 202.

The high-to-low transition of the clock that switches the conventional latch circuitry 100 from the sample to the hold is lined up at the middle of the data bit. This gives an optimum value for possible delay variations between transition edges of the clock and the incoming data.

Figure 2C:
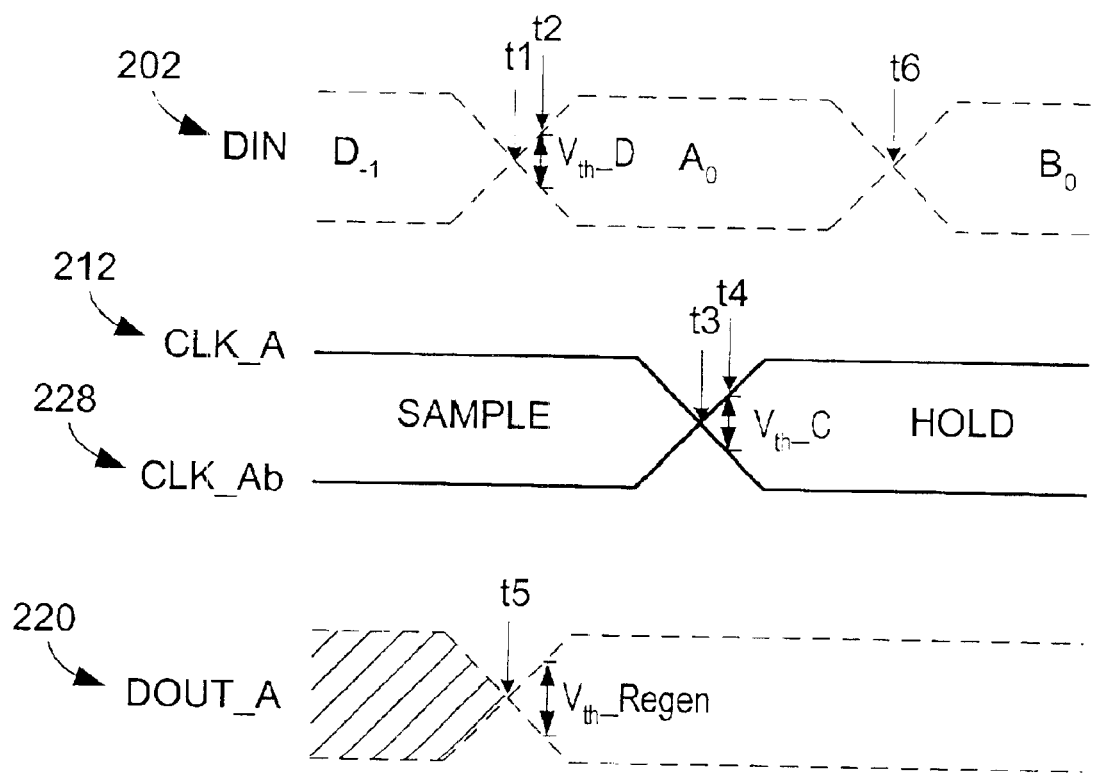
FIG. 2c (PRIOR ART) is a close-up view of the data and clock transitions shown in FIG. 2b (PRIOR ART)

Referring now to FIG. 2c (PRIOR ART), therein is shown a close-up view of the data and clock transitions shown in the boxed time interval of FIG. 2b (PRIOR ART) illustrating the details of ideal transitions of the data input DIN 202, the complementary CLK_A 212 and CLK_Ab 228, and the demultiplexed data output DOUT_A 220 of the Latch A 204.

The time marks t1, t3, and t5 are the zero-crossing times of the data input DIN 202, the CLK_A 212, the CLK_Ab 228, and the demultiplexed data output DOUT_A 220, respectively. A zero-crossing is defined as a signal level passing the mid-value when the signal is switched from high to low or from low to high. With reference to FIG. 1 (PRIOR ART), at time t2, the differential voltage of the data input DIN 202 passes through the threshold of the first and second sampling FETs 102 and 104, $V_{th\_}D$, and causes this pair of FETs to change state. At time t4, the voltage of CLK_Ab-CLK_A is over the threshold of the first and second clock FETs 110 and 112, Vth_C. At this moment, there is less than half of the current $I_0$ left in the first clock FET 110 and the first and second sampling FETs 102 and 104. The voltage gain in the positive-feedback loop of the holding circuitry 105 and the load circuitry 113 is now higher than the voltage gain from the data input DIN 202 through the sampling circuitry 101 to the demultiplexed data output DOUT_A 220. Further voltage change at the data input DIN 202 has little effect in influencing the demultiplexed data output DOUT_A 220 or DOUT_Ab 219. The logic state at the output will be set by regeneration.

Figure 2D:
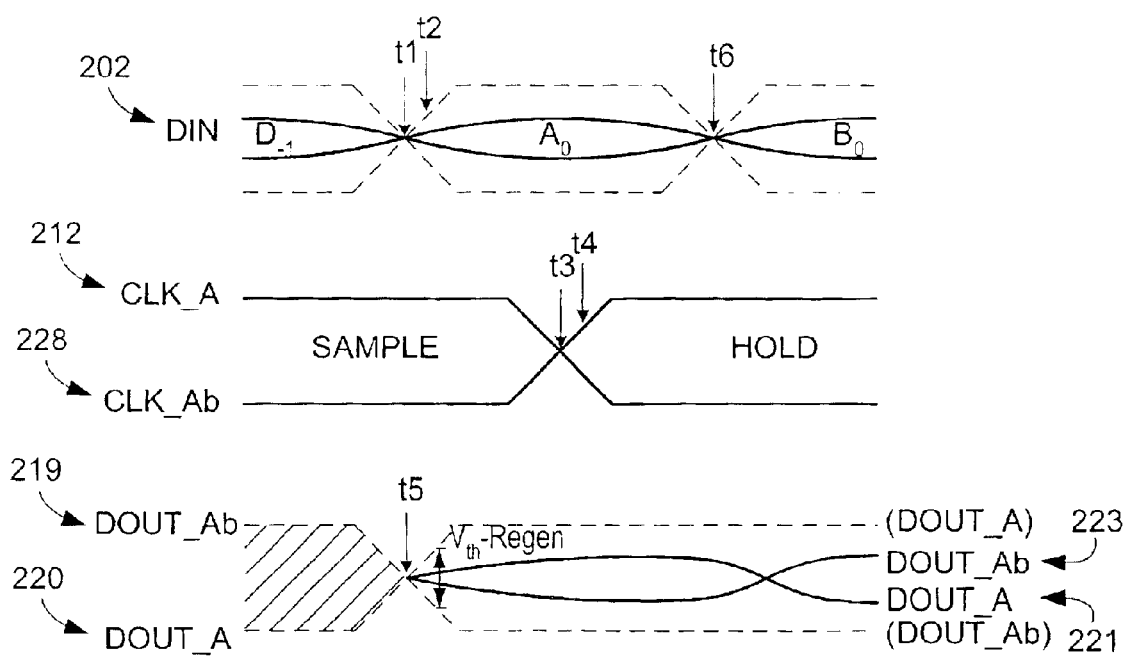
FIG. 2d (PRIOR ART) is a close-up view of the data and clock transitions shown in FIG. 2b (PRIOR ART) when data input is at low amplitude and regeneration fails to occur.

Referring now to FIG. 2d (PRIOR ART), therein is shown a close-up view of the data and clock transitions shown in FIG. 2b (PRIOR ART) when the data input DIN 202 is at low amplitude and regeneration fails to occur as occurs in the real world. The dotted lines in the drawing depict the ideal, large data input DIN 202 case. After the time t4 where actual DOUT_A 221 and actual DOUT_Ab 223 are the actual data output signals, if the actual differential voltage DOUT_A–DOUT_Ab is over the threshold, $V_{th\_}Regen$, of the positive-feedback loop of the first and second holding FETs 106 and 108 and the pull-up load FETs 114 and 116, regeneration will start and the conventional latch system 100 will hold the sampled single state of the data input DIN 202. The waveform diagram shown in FIG. 2c (PRIOR ART) has DOUT_A–DOUT_Ab over $V_{th\_}Regen$ at the time t>t4. However, in a real case, the amplitude of the incoming data could be very small due to an attenuation caused by external transmission media. This will result in the conventional latch system 100 not having enough over-drive, and it will take a longer time for the first and second sampling FETs 102 and 104 of the conventional latch system 100 to reach the threshold $V_{th\_}D$. The consequence is that it will also delay the transition of the demultiplexed data output DOUT_A 220 in such a way that when the clock CLK_A 212 is switched from high to low, the differential voltage built-up at DOUT_A–DOUT_Ab is not sufficient to produce the regeneration effect. The conventional latch system 100 will then lose the effort of sampling the DIN 202 and the demultiplexed data output DOUT_A 220 will return to an incorrect previously held value of the demultiplexed data output DOUT_A 220.

The action of the conventional latch system 100 at the transition from sample to hold can be explained by a simplified incremental transfer function:

$$[DOUT-DOUTb](t+dt)=Ah*[DOUT-DOUTb](t)+As*[DIN-DINb](t+dt) \quad \text{Eq. (1)}$$

where dt is an incremental time after the sample mode and Ah and As are the voltage gains from the holding FETs 106 and 108 and the sampling FETs 102 and 104, respectively, to the DOUT 136 and DOUTb 138.

If the zero-crossing times of the clock (t3) and the subsequent switched data bit (t6) are too close and the switching speed of the current $I_0$ from the first clock FET 110 to the second clock FET 112 is not fast enough, the output of the conventional latch system 100 does not have time to build the voltage required to begin regeneration. Regeneration begins when $[DOUT-DOUTb](t+dt)>V_{th\_}Regen$. In Eq. (1), the sign of the [DIN-DINb](t+dt) is opposite of that of [DOUT-DOUTb](t), when the following bit has the opposite state from the sampled bit, which further reduces the value of the left side of the equation and pulls the conventional latch system 100 away from the regeneration. The conventional latch system 100 will therefore lose the data in the hold mode.

A hold time is also fully described in the Background and is another critical parameter for differential latch system. From FIG. 2c (PRIOR ART), the hold time is the minimum time between t3 and t6 such that the conventional latch system 100 can hold the data bit $A_0$ while the DIN 126 is switched to $B_0$. A smaller hold time in the conventional latch system 100 implies a fast regeneration, which normally requires a faster technology to implement. For a multiple-phase data demultiplexer system, such as the four-phase data demultiplexer system 200, the disturbance from the subsequent switching bit, the bit $B_0$ in the above example, limits the ability of the conventional latch system 100 to work at a higher speed.

Figure 3:
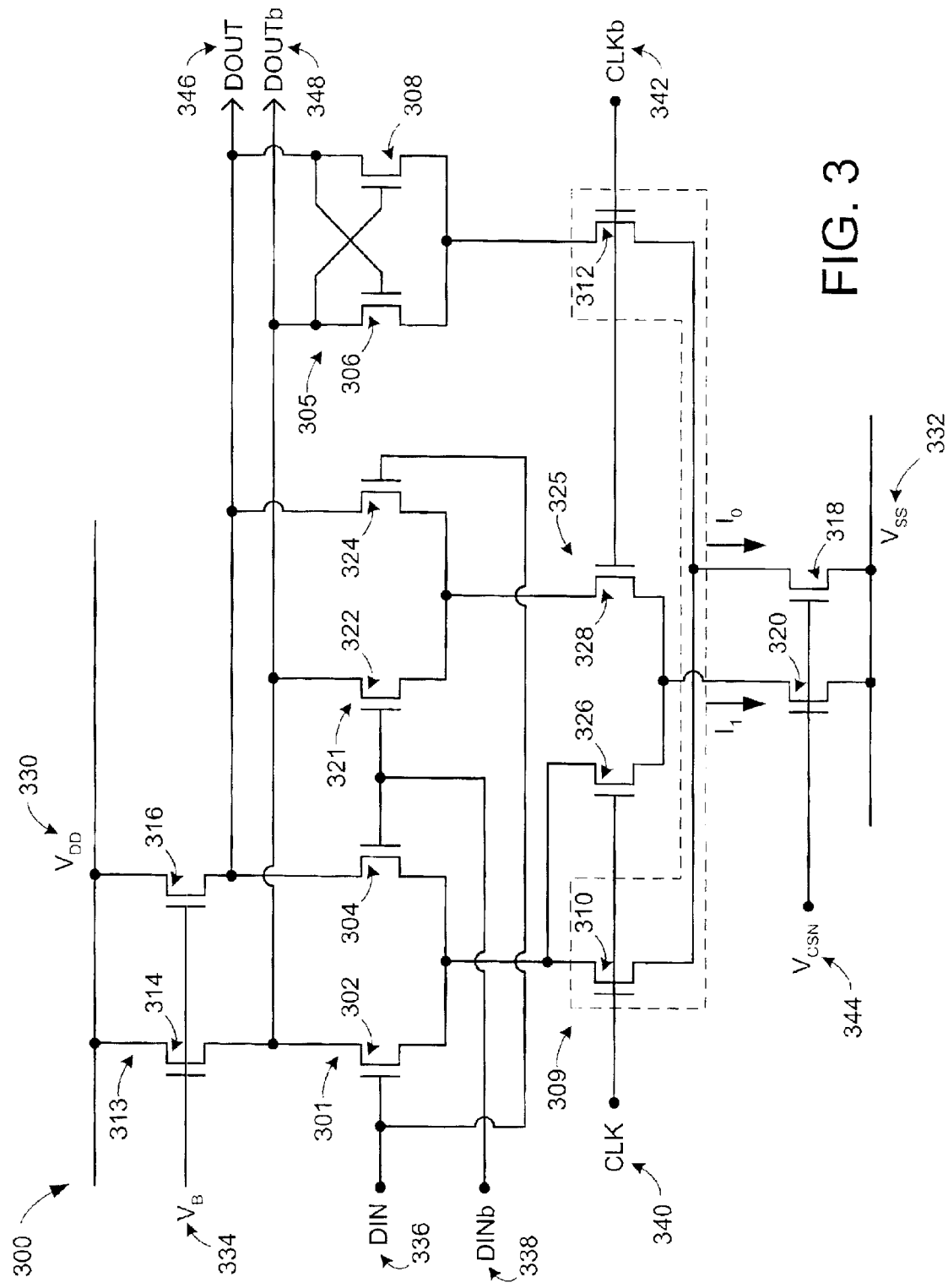
FIG. 3 is a circuit schematic of high-sensitivity differential latch system according to the present invention.

Referring now to FIG. 3, therein is shown a circuit schematic of high-sensitivity differential data latch system, henceforth to be referred to as "Other People's Money" latch system or OPM latch system 300 of the current invention implemented in MOS technology. The OPM latch system 300 includes first and second sampling circuitry 301 and 321, holding circuitry 305, first and second clocking circuitry 309 and 325.

The first sampling circuitry 301 consists of a differential pair of first and second sampling FETs 302 and 304.

The second sampling circuitry 321 consists of a differential pair of first and second sampling FETs 322 and 324.

The holding circuitry 305 consists of a differential pair of first and second holding FETs 306 and 308.

The first clocking circuitry 309 consists of a differential pair of first and second clock FETs 310 and 312 and the second clocking circuitry 325 consists of a differential pair of first and second clock FETs 326 and 328. The first and second clock FETs 310 and 312 are respectively connected to the common-source of the first sampling circuitry 301 and of the holding circuitry 305, while the first and second clock FETs 326 and 328 are respectively connected to the common-source of the first sampling circuitry 301 and of the second sampling circuitry 321.

Load circuitry 313 acts as output loads and consists of first and second pull-up load FETs 314 and 316, which are connected to drains of the first and second sampling circuitry 301 and 321 and of the holding circuitry 305.

First and second current sources 318 and 320 are biased by a voltage source $V_{CSN}$ 344 to produce respective currents $I_O$ and $I_1$ from the sources of the first and second clocking circuitry 309 and 325.

The first and second clock FETs 310 and 312 of the first clocking circuitry 309 form a current switch driven by a differential pair of clocks at first and second clocks CLK 340 and CLKb 342. The common-source of the first and second clock FETs 310 and 312 is connected to the current source 318 and can direct the current $I_0$ from either the common-source of the first sampling circuitry 301 or of the holding circuitry 305.

The first and second clock FETs 326 and 328 of the second clocking circuitry 325 form a current switch driven at the first and second clocks CLK 340 and CLKb 342. The common-source of the first and second clock FETs 326 and 328 is connected to the current source 320 and can direct the current $I_1$ from either the common-source of the first sampling circuitry 301 or the second sampling circuitry 321.

The OPM latch system 300 is connectable to be powered by a positive power supply $V_{DD}$ 330 and a negative power supply $V_{SS}$ 332.

A differential pair of first and second data inputs DIN 336 and DINb 338 receive differential input data signals and are invertedly connected to bias the second and first sampling FETs 324 and 322, respectively; i.e., the gate of the second sampling FET 324 is connected to the DIN 336 and the gate of the first sampling FET 322 is connected to the DINb 338, which output differential output data signals in the form of differential sample-and-bold of the signals on the DIN 336 and DINb 338 at higher sensitivity and speed than previously possible.

When the voltage at the CLK 340 exceeds that at the CLKb 342 by a sufficient amount, the first clock FET 310 is switched on and the second clock FET 312 is switched off in the first clocking circuitry 309. The current $I_O$ flows through the first clock FET 310 from the first sampling circuitry 301.

Also, when the voltage at the CLK 340 exceeds that at the CLKb 342 by a sufficient amount, the first clock FET 326 is switched on and the second clock FET 328 is switched off in the second clocking circuitry 325. The current $I_1$ flows through the first clock FET 326 from the first sampling circuitry 301. At this point in time, the OPM latch system 300 is in the sample mode and its circuit configuration is equivalent to a differential amplifier with the inputs as the DIN 336 and DINb 338 of a first bit, such as $A_0$ in FIG. 2d (PRIOR ART), and the outputs as the DOUT 346 and DOUTb 348, respectively.

When the voltage at the CLKb 342 exceeds that at the CLK 340 by a sufficient amount, the second clock FET 312 is switched on and the first clock FET 310 is switched off. The current $I_O$ flows through the second clock FET 312 from the holding circuitry 305. At this point in time, the OPM latch system 300 is in the hold mode. The holding circuitry 305 forms a positive feedback-loop at the outputs of the DOUT 346 and DOUTb 348, respectively.

Also, when the voltage at the CLKb 342 exceeds that at the CLK 342 by a sufficient amount, the second clock FET 328 is switched on and the first clock FET 326 is switched off in the second clocking circuitry 325. The current $I_1$ flows through the second clock FET 328 from the second sampling circuitry 321. At this point in time, the second sampling circuitry 321 is in the sample mode, and its circuit configuration is equivalent to a differential amplifier with the inputs as the DINb 338 and DIN 336 of a second bit, such as $B_0$ in FIG. 2d (PRIOR ART), and outputs inverted as the DOUTb 348 and DOUT 346, respectively. This inversion occurs because the connections from DINb 338 and DIN 336 are respectively to the second and first sampling FETs 324 and 322 in the second sampling circuitry 321 as compared to respectively to the first and second sampling FETs 302 and 304 in the first sampling circuitry 301.

The OPM latch system 300 has sample and hold modes, which correspond to changes in the differential input clock. When the first phase differential clock input CLK 340 is high and the second phase differential input clock CLKb 342 is low, the OPM latch system 300 is in the sample mode. When the reverse is true, the OPM latch system 300 is in a combined inverted sample and hold mode.

The first sampling FET 302, the first sampling FET 322, and the first holding FET 306 are all connected to the first pull-up load FET 314 and the second sampling FET 304, the second sampling FET 324, and the second holding FET 308 are all connected to the second pull-up load FET 316. The first and second pull-up load FETs 314 and 316 are biased by a gate voltage $V_B$ 334 to act as loads for the first and second sampling circuitries 301 and 321 and also provide a positive feedback loop for the holding circuitry 305.

Once the differential voltage, defined as DOUT 346–DOUTb 348, is over the threshold value of the feedback loop, the OPM latch system 300 will continue to proceed to the direction of enhancing the value of the differential voltage until it reaches a full logic high or low state. The state of logic high or low is defined by the final value of the differential voltage being positive or negative, respectively.

It has been discovered that the gain ratio of the first sampling FETs 302 and 304 to the second sampling FETs 322 and 324 should be greater than unity (1), and is normally set at or around 3. When the next bit in the serial data stream is in an opposite state from the prior bit, there is a significant amount of disturbance in the voltage at the output DOUT 346 and DOUTb 348. This disturbance would normally reduce the amount of voltage available for regeneration and cause loss of the prior bit. In the OPM latch system 300, the gain ratio will cause the second sampling circuitry 321 to provide a certain amount of voltage to enhance the previously sampled bit. When the next bit in the serial data stream is in the same state from the prior bit, there is less significant disturbance in the voltage at the output, and the decrease in the amount of voltage at the output for a same state bit is the ratio of the voltage gain of the second sampling circuitry 321 to that of the holding circuitry 305 which has negligible effect.

Basically, because of the configuration of the OPM latch system 300, when the first and second data bits $A_0$ and $B_0$ in the data input DIN 202 are at identical states, the configuration results in a reduced held first data bit $A_0$ at the data output. However, this reduction is not great enough to pull the held first data bit $A_0$ out of the OPM latch system 300, keeping the held value intact. In contrast, when the first and second data bits $A_0$ and $B_0$ in the data input DIN 202 are at opposite states, the second data bit $B_0$ is used to boost the output to get to the regeneration state faster at lower amplitudes of the DIN 336 and DINb 338. Since turbulence is only caused when first and second data bits $A_0$ and $B_0$ are in opposite states and not when they are in the same states, the ability of the OPM latch system 300 to boost the sensitivity and extend the amount of time for the OPM latch system 300 to hold the sampled data $A_0$ in the turbulent case effectively compensates for the turbulence and allows for the use of a faster clock speed at a faster data rate system.

Boosting, or increasing the sensitivity of the circuit, is defined as decreasing the minimum operational voltage in comparing the conventional latch system 100 of FIG. 1 (PRIOR ART) to the OPM latch system 300. The minimum operational voltage is the required amplitude of the data stream at the differential inputs DIN 126/336 and DINb 128/338 where a latch system can achieve the regeneration state. FIG. 2d (PRIOR ART) is an example where the amplitude of the data stream was not great enough for regeneration to occur in the conventional latch system.

Figure 4:
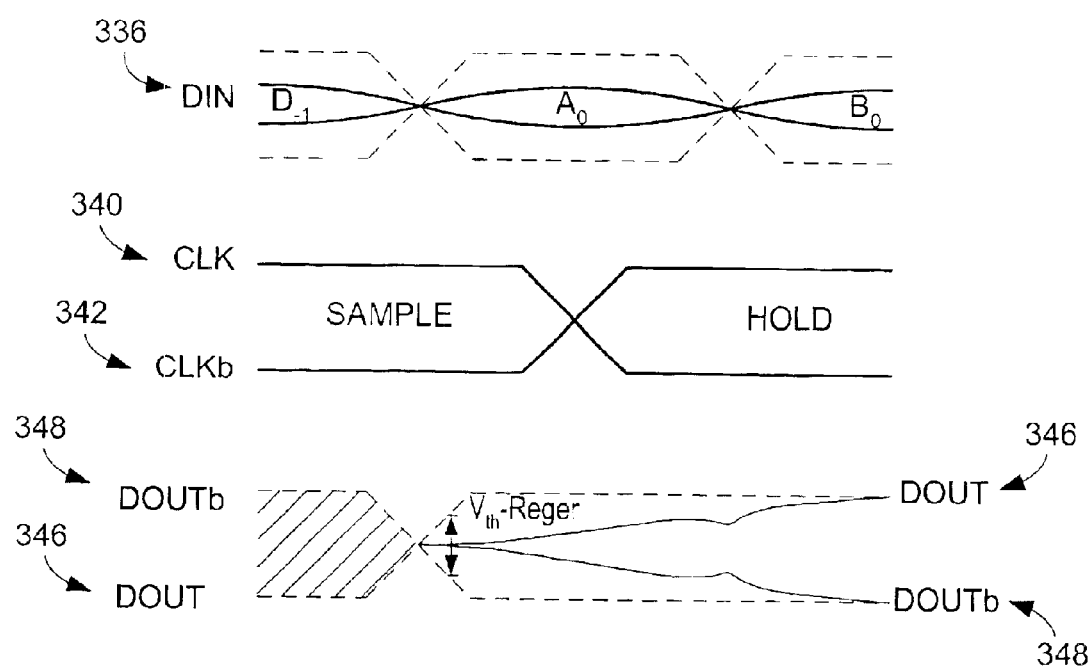
FIG. 4 is a close-up view of the data and clock transitions of the present invention when data input has a low amplitude and regeneration occurs.

Referring now to FIG. 4, therein is shown a close-up view of the data and clock transitions of the current invention. It contrasts with the waveform shown in FIG. 2d (PRIOR ART) due to the differences in the OPM latch system 300. Like the conventional latch system 100 of FIG. 1 (PRIOR ART), the OPM latch 300 has hold and sample modes, shown in the different clock cycles in the waveforms for the first and second phase differential input clock CLK 340 and CLKb 342. The principle behind the OPM latch system 300 is adding an extra signal path from the input DIN 336 to the output DOUT 346 when the OPM latch system 300 is in the hold mode. The incremental transfer function shown in Eq. (1) for the conventional latch system 100 of FIG. 1 (PRIOR ART) becomes:

$$\text{Eq. (2):} \quad [DOUT - DOUTb](t + dt) = Ah*[DOUT - DOUTb](t) + \\ As*[DIN - DINb](t + dt) - \\ As'*[DIN - DINb](t + dt)$$

where As' is the voltage gain from the second sampling FETs 322 and 324 to the output [DOUT–DOUTb] when the second phase differential input clock CLKb 342 is high. By choosing the current ratio of $I_1/I_0$, which is related to the voltage gain As'/As, the OPM latch system 300 achieves the advantage of using the subsequent data bit $B_0$ like "other people's money" to benefit the current, sampled and held bit $A_0$, if $B_0$ is at the opposite state of $A_0$, in enhancing the built-up voltage at [DOUT–DOUTb]. This is what is referred to by the OPM latch system 300 having increased sensitivity compared to the conventional data latch system 100. Because of its lower input voltage requirements, the OPM latch system 300 can accurately operate with less than ideal lower amplitude input signals found in real-world applications. If the subsequent bit $B_0$ is at the same state as the current sampled and held bit $A_0$, the final value of the voltage [DOUT–DOUTb] will be reduced. However, since the polarity from $A_0$ to $B_0$ does not change, the output [DOUT–DOUTb] will keep its previous data state.

The outputs DOUT 346 and DOUTb 348 of the OPM latch system 300 are connected to the input data DIN 336 and DINb 338 through the second sampling FETs 322 and 324 even in the hold mode. Although the voltage gain from input DIN 336 to the output DOUT 346 of the OPM latch system 300 is relatively small as compared to the voltage gain within the positive-feedback loop. In some applications, it is necessary to completely isolate the output of the OPM latch system 300 to the incoming data.

Referring now to FIG. 5, therein is shown a block diagram of a system 400 of the present invention, which achieves complete isolation from the input to the output at the hold mode. The system 400 consists of the OPM latch system 300 connected to conventional differential latch system 100. The system 400 has the inputs DIN 336 and DINb 338, which are connected to the OPM latch system 300. The outputs DOUT 346 and DOUTb 348 of the OPM latch system 300 are connected to the inputs of the conventional latch system 100 which in turn has differential outputs Q 352 and Qb 354 that are the outputs of the system 400. The first and second phasse differential input clock CLK 340 and CLKb 342 are connected to both latch systems but the connections to the conventional latch system 100 are inverted as compared to those of the OPM latch system 300.

Referring now to FIG. 6, therein is shown a block diagram of an four-phase data demultiplexer system 400 according to the present invention in which four data sampling channels are connected by four OPM latch systems designated as Latch A 404, Latch B 406, Latch C 408, and Latch D 410. The Latch A 404, Latch B 406, Latch C 408, and Latch D 410 each contain clock circuitry (internal to the latch systems) to be driven by demultiplexer clock signals at CLK_A 412, CLK_B 414, CLK_C 416, and CLK_D 418, respectively. The Latch A 404, Latch B 406, Latch C 408, and Latch D 410 are connected at their inputs to a data input DIN 402, and each has a respective demultiplexed data output DOUT_A 420, DOUT_B 422, DOUT_C 424, and DOUT_D 426, which is a single state of the data input.

As would be evident to those skilled in the art, the present invention is not limited to FETs in MOS technology but may be implemented in many different electronic technologies including, without limitation, semiconductor technologies such as bipolar and gallium arsenide and non-semiconductor technologies such as vacuum tube. The OPM latch system 300 can be used in the same applications as the conventional latch system 100; e.g., in the four-phase data demultiplexer system 200 where the latch systems 204, 206, 208, and 210. This significantly increases the speed of the four-phase demultiplexer system 200 in a novel manner.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations which fall within the spirit of the included claims. All matters hither-to-fore set forth herein or shown in the accompanying drawings are to be interpreted in an illustrative and non-limiting sense.

The invention claimed is:

1. A data latch system comprising:
   a data input for providing a first data bit having a first duration and a second data bit having a second duration, the first and second data bits having the same or opposite state;
   a data output for providing the first data bit for the first and second durations;
   first sampling circuitry connected to the data input and the data output for the first duration to provide the first data bit to the data output;
   second sampling circuitry invertedly connected to the data input and connected to the data output for the second duration to provide the second data bit inverted to the data output; and
   holding circuitry connected to the data output for the second duration whereby the holding circuitry holds the first data bit and the second sampling circuitry connects the second data bit inverted to the data output to enhance the held first data bit when the first and second data bits have different states.

2. The data latch system as claimed in claim 1 including clock circuitry connected to the first sampling circuitry, the second sampling circuitry, and the holding circuitry responsive to clock signals to establish the first and second durations.

3. The data latch system as claimed in claim 2 including a current source connected to the clock circuitry.

4. The data latch system as claimed in claim 1 including load circuitry connected to the first sampling circuitry, the second sampling circuitry, and the holding circuitry to provide pull-up loads therefor.

5. The data latch system as claimed in claim 1 wherein the gain ratio of the first sampling circuitry to the second sampling circuitry is greater than unity.

6. The data latch system as claimed in claim 1 including:
a second data latch system having a second data input, a third sampling circuitry connected to the second data input, a second data output connected to the third sampling circuitry, and a second holding circuitry connected to the second data output;
and wherein:
the data output is connected to the second data input and the second data output is isolated from the data input.

7. The data latch system as claimed in claim 6 including:
clock circuitry connected to the first sampling circuitry, the second sampling circuitry, and the holding circuitry responsive to clock signals to establish the first and second durations;
second clock circuitry connected to the third sampling circuitry and the second holding circuitry responsive to the clock signals to establish first and second durations for the second data latch system.

8. The data latch system as claimed in claim 1 including:
a demultiplexer input providing a plurality of sequential data bits;
a plurality of data latch systems, each of the plurality of data latch systems having:
a data input connected to the demultiplexer input,
a data output for providing each of the sequential data bits for successive times, and
first and second sampling circuitry and holding circuitry connected to the data input thereof whereby the holding circuitry holds the first of a pair of sequential data bits and the second sampling circuitry connects the second of the sequential pair of data bits to the data output to enhance the held first of the sequential pair of data bits when the first and second of the pair of sequential data bits have different states;
and wherein:
the data input is connected to the demultiplexer input; and
the data output provides a first of the plurality of sequential data bits for the first of the successive times.

9. The data latch system as claimed in claim 8 wherein:
the plurality of data latch systems each includes:
clock circuitry connected to the first sampling circuitry, the second sampling circuitry, and the holding circuitry responsive to clock signals to establish the first and second durations.

10. The data latch system as claimed in claim 9 wherein:
the data output provides the first of the plurality of sequential data bits for the first of the successive times in response to demultiplexer clock signals; and
the plurality of data latch systems provides the plurality of sequential data bits in response to the demultiplexer clock signals.

11. A data latch system comprising:
a differential data input for providing a first differential data bit having a first duration and a second differential data bit having a second duration, the first and second differential data bits having the same or opposite state;
a differential data output for providing the first differential data bit for the first and second durations;
first differential sampling circuitry connected to the differential data input and the differential data output for the first duration to provide the first differential data bit to the differential data output;
second differential sampling circuitry invertedly connected to the differential data input and connected to the differential data output for the second duration to provide the second differential data bit inverted to the differential data output; and
holding circuitry connected to the differential data output for the second duration whereby the holding circuitry holds the first differential data bit and the second differential sampling circuitry connects the second differential data bit to the differential data output to enhance the held first differential data bit when the first and second differential data bits have different states.

12. The data latch system as claimed in claim 11 including differential clock circuitry connected to the first differential sampling circuitry, the second differential sampling circuitry, and the holding circuitry responsive to differential clock signals to establish the first and second durations.

13. The data latch system as claimed in claim 12 including a current source connected to the differential clock circuitry.

14. The data latch system as claimed in claim 11 including load circuitry connected to the first differential sampling circuitry, the second differential sampling circuitry, and the holding circuitry to provide pull-up loads therefor.

15. The data latch system as claimed in claim 11 wherein the gain ratio of the first differential sampling circuitry to the second differential sampling circuitry is greater than unity.

16. The data latch system as claimed in claim 11 including:
a second data latch system having a second differential data input, a third differential sampling circuitry connected to the second differential data input, a second differential data output connected to the third differential sampling circuitry, and a second holding circuitry connected to the second differential data output;
and wherein:
the differential data output is connected to the second differential data input and the second differential data output is isolated from the differential data input.

17. The data latch system as claimed in claim 16 including:
differential clock circuitry connected to the first differential sampling circuitry, the second differential sampling circuitry, and the holding circuitry responsive to differential clock signals to establish the first and second durations;
second differential clock circuitry connected to the third differential sampling circuitry and the second holding circuitry responsive to the differential clock signals to establish first and second durations for the second differential data latch system.

18. The data latch system as claimed in claim 11 including:
a demultiplexer input providing a plurality of sequential data bits;
a plurality of data latch systems, each of the plurality of data latch systems having:
a data input connected to the demultiplexer input,
a data output for providing each of the sequential data bits for successive times, and
first and second sampling circuitry and holding circuitry connected to the data input thereof whereby the holding circuitry holds the first of a pair of sequential data bits and the second sampling circuitry connects the second of the sequential pair of data bits to the data output to enhance the held first of the sequential pair of data bits when the first and second of the pair of sequential data bits have different states;

and wherein:

the data input is connected to the demultiplexer input; and the data output provides a first of the plurality of sequential data bits for the first of the successive times.

19. The data latch system as claimed in claim 18 wherein:

the plurality of data latch systems each includes:

clock circuitry connected to the first sampling circuitry, the second sampling circuitry, and the holding circuitry responsive to clock signals to establish the first and second durations.

20. The data latch system as claimed in claim 19 wherein:

the data output provides the first of the plurality of sequential data bits for the first of the successive times in response to demultiplexer clock signals; and the plurality of data latch systems provides the plurality of sequential data bits in response to the demultiplexer clock signals.

21. A data latch system comprising:

a differential data input for providing a first differential data bit having a first duration and a second differential data bit having a second duration, the first and second differential data bits having the same or opposite state;

a differential data output for providing the first differential data bit for the first and second durations;

first differential sampling circuitry connected to the differential data input and the differential data output for the first duration to provide the first differential data bit to the differential data output;

second differential sampling circuitry invertedly connected to the differential data input and connected to the differential data output for the second duration to provide the second differential data bit inverted to the differential data output;

holding circuitry connected to the differential data output for the second duration whereby the first differential sampling circuitry provides the first differential bit during the first duration and the holding circuitry holds the first differential data bit and the second differential sampling circuitry connects the second differential data bit to the differential data output to enhance the held first differential data bit during the second duration when the first and second differential data bits have different states;

first differential clock circuitry connected to the first differential sampling circuitry and the holding circuitry; and second differential clock circuitry connected to the first differential sampling circuitry and the second differential sampling circuitry whereby the first differential clock circuitry and the second differential clock circuitry respond to differential clock signals to establish the first and second durations.

22. The data latch system as claimed in claim 21 including:

a current source connected to the first and second differential clock circuitries; and load circuitry connected to the first differential sampling circuitry, the second differential sampling circuitry, and the holding circuitry to provide pull-up loads therefor.

23. The data latch system as claimed in claim 21 wherein the gain ratio of the first differential sampling circuitry to the second differential sampling circuitry is about three.

24. The data latch system as claimed in claim 21 including:

a second data latch system having a second differential data input, a third differential sampling circuitry connected to the second differential data input, a second differential data output connected to the third differential sampling circuitry, a second holding circuitry connected to the second differential data output and second differential clock circuitry connected to the third differential sampling circuitry and the second holding circuitry responsive to the differential clock signals to establish first and second durations for the second differential data latch system;

and wherein:

the differential data output is connected to the second differential data input and the second differential data output is isolated from the differential data input.

25. The data latch system as claimed in claim 21 including:

a demultiplexer input providing a plurality of sequential differential data bits;

a plurality of data latch systems, each of the plurality of data latch systems having:

a differential data input connected to the demultiplexer input, a differential data output for providing each of the plurality of sequential differential data bits for successive times, first and second differential sampling circuitry and holding circuitry connected to the differential data input thereof whereby the holding circuitry holds the first of the plurality of sequential differential data bits and the second differential sampling circuitry connects the second of the plurality of sequential differential data bits to the differential data output to enhance the held first of the plurality of sequential differential data bits when the first and second of the plurality of sequential differential data bits have different states, and differential clock circuitry connected to the first differential sampling circuitry, the second differential sampling circuitry, and the holding circuitry responsive to clock signals to establish the first and second durations;

and wherein:

the differential data input is connected to the demultiplexer input; and the differential data output provides a first of the plurality of sequential differential data bits for the first of the successive times.

26. The data latch system as claimed in claim 25 wherein:

the data output provides the first of the plurality of sequential differential data bits for the first of the successive times in response to demultiplexer clock signals; and the plurality of data latch systems provides the plurality of sequential differential data bits in response to the demultiplexer clock signals.

* * * * *